United States Patent
White et al.

(10) Patent No.: US 12,136,902 B1
(45) Date of Patent: Nov. 5, 2024

(54) DRIVE CIRCUIT WITH PREDISTORTION

(71) Applicant: HRL Laboratories, LLC, Malibu, CA (US)

(72) Inventors: Carson White, Agoura Hills, CA (US); Evan Schlomann, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 12 days.

(21) Appl. No.: 18/312,979

(22) Filed: May 5, 2023

Related U.S. Application Data

(60) Provisional application No. 63/339,257, filed on May 6, 2022.

(51) Int. Cl.
   *H03F 3/217* (2006.01)
   *H03F 1/32* (2006.01)
   *H04B 1/04* (2006.01)

(52) U.S. Cl.
   CPC ........... *H03F 3/217* (2013.01); *H03F 1/3241* (2013.01); *H04B 1/0475* (2013.01); *H03F 2200/451* (2013.01); *H04B 2001/0425* (2013.01)

(58) Field of Classification Search
   CPC ...... H03F 3/217; H03F 1/3241; H03F 1/3247; H03F 1/3223; H04B 1/0475
   See application file for complete search history.

(56) References Cited

U.S. PATENT DOCUMENTS

| | | | |
|---|---|---|---|
| 8,355,460 B2 | 1/2013 | Dickey | |
| 9,571,132 B1 | 2/2017 | Hershberger | |
| 11,469,508 B1* | 10/2022 | Parsche | H01Q 7/00 |
| 11,906,992 B2* | 2/2024 | Khlat | H03F 3/265 |
| 2011/0221526 A1* | 9/2011 | Quan | H03F 1/26 |
| | | | 330/149 |
| 2015/0031318 A1* | 1/2015 | McCallister | H03F 3/193 |
| | | | 455/114.3 |
| 2015/0236729 A1* | 8/2015 | Peng | H03F 1/56 |
| | | | 455/114.3 |
| 2015/0244325 A1* | 8/2015 | Irvine | H03F 3/21 |
| | | | 375/238 |
| 2023/0353098 A1* | 11/2023 | Henzler | H03F 1/0227 |

OTHER PUBLICATIONS

Campbell, C. F. et al., "Wideband High Power GaN on SiC SPDT Switch MMICs", IMS 2010, 2010, pp. 145-148, IEEE.
Imam, M. et al., "Efficacy of GaN-on-Si Technology for Realizing Commercially Viable Monolithic Bi-Directional Switches", IS02.2, Mar. 22, 2022, pp. 1-23.

(Continued)

*Primary Examiner* — Khanh C Tran
(74) *Attorney, Agent, or Firm* — Lewis Roca Rothgerber Christie LLP

(57) ABSTRACT

A drive circuit with predistortion. In some embodiments, a system includes a signal input, a predistortion circuit, and an amplifier circuit. The predistortion circuit may be operatively coupled to the signal input and to the amplifier circuit and configured to modify a radio frequency (RF) signal received at the signal input to cause the amplifier circuit to drive, into a load connected to the amplifier circuit, a current that is substantially a replica of the input signal.

20 Claims, 8 Drawing Sheets

(56) References Cited

OTHER PUBLICATIONS

Kinoshita, Y. et al., "100 A Solid State Circuit Breaker Using Monolithic GaN Bidirectional Switch with Two-Step Gate-Discharging Technique", 2020, pp. 652-657, IEEE.
Lal, R. et al., "GaN Four Quadrant Switches: Ready For Prime Time?", IS02.3, Mar. 22, 2022, 28 pages.
Morita, T. et al., "650V 3.1mQcm2 GaN-based Monolithic Bidirectional Switch Using Normally-off Gate Injection Transistor", 2007, pp. 865-868, IEEE.
Veliadis, V., "Wide-Bandgap Bidirectional Switches and Key Applications", IS02.1, Mar. 22, 2022, pp. 1-34.

\* cited by examiner

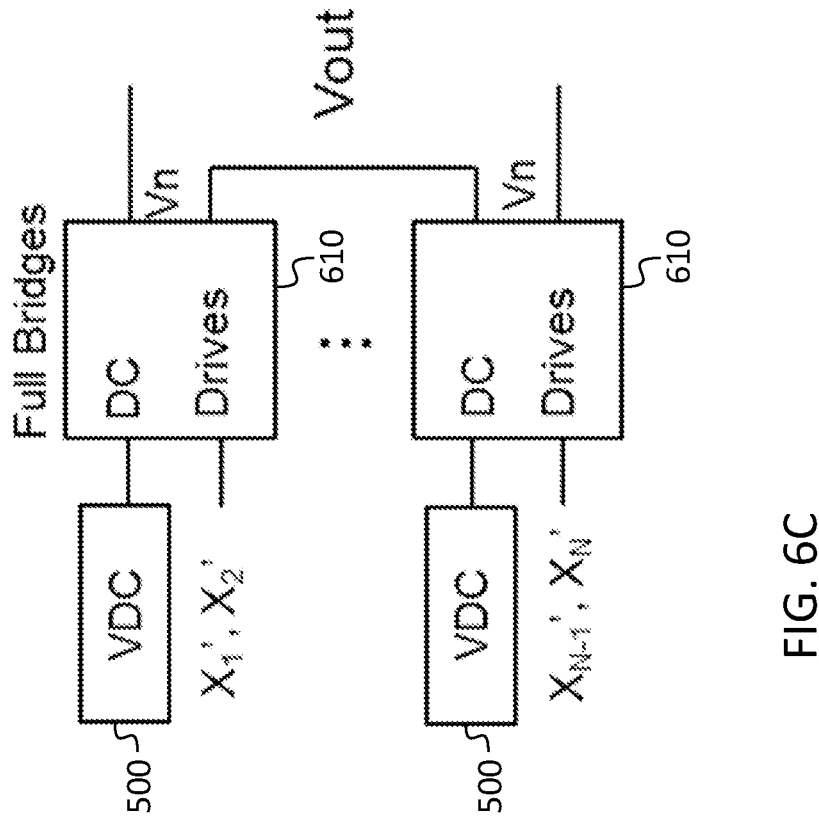
FIG. 6C
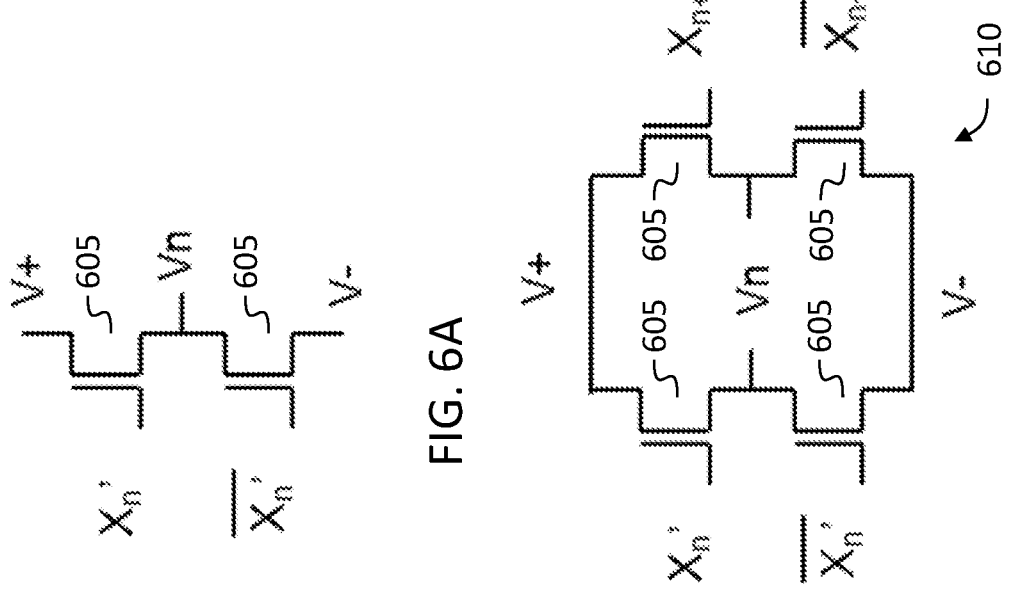
FIG. 6A
FIG. 6B

DRIVE CIRCUIT WITH PREDISTORTION

CROSS-REFERENCE TO RELATED APPLICATION(S)

The present application claims priority to and the benefit of U.S. Provisional Application No. 63/339,257, filed May 6, 2022, entitled "RADIO-FREQUENCY (RF) CURRENT SOURCE: PREDISTORTION", the entire content of which is incorporated herein by reference.

FIELD

One or more aspects of embodiments according to the present disclosure relate to electronic circuits, and more particularly to a drive circuit with predistortion.

BACKGROUND

An electronic circuit driving a load may drive a current through the load that depends on the impedance of the load. In some circumstances, e.g., if the load is an antenna or a resonated antenna, the impedance of the load may be frequency-dependent.

It is with respect to this general technical environment that aspects of the present disclosure are related.

SUMMARY

According to an embodiment of the present disclosure, there is provided a system, including: a signal input; a predistortion circuit; and an amplifier circuit, the predistortion circuit being operatively coupled to the signal input and to the amplifier circuit and configured to modify a radio frequency (RF) signal received at the signal input to cause the amplifier circuit to drive, into a load connected to the amplifier circuit, a current that is substantially a replica of the input signal.

In some embodiments, the load includes an antenna.

In some embodiments, the system is configured to operate within an operating frequency range, and the antenna has a length less than one half of a wavelength corresponding to the maximum frequency in the operating frequency range.

In some embodiments, the load further includes an inductor or a capacitor connected in series with the antenna.

In some embodiments, the antenna has a length of less than one half of a wavelength corresponding to a resonant frequency of the load.

In some embodiments, the amplifier circuit is a switching amplifier.

In some embodiments, the system further includes a current sensor, configured to measure a load current.

In some embodiments, the system further includes a frequency response corrector for adjusting the frequency response of the predistortion circuit.

In some embodiments, the frequency response corrector is configured: to estimate a transfer function from a signal at the signal input to a load current; and to adjust the frequency response of the predistortion circuit so as to reduce a difference between the estimated transfer function and a target transfer function.

In some embodiments, the target transfer function has a magnitude that is constant as a function of frequency.

In some embodiments, the target transfer function has a phase that is a linear function of frequency.

In some embodiments, the predistortion circuit includes a discrete time filter having a plurality of coefficients, and the frequency response corrector is configured to adjust the coefficients.

In some embodiments, the discrete time filter is a finite impulse response filter.

In some embodiments, the discrete time filter is an infinite impulse response filter.

According to an embodiment of the present disclosure, there is provided a method for driving a load with a system, the system including: a signal input; a predistortion circuit; and an amplifier circuit, the method including: modifying, by the predistortion circuit, a radio frequency (RF) signal received at the signal input to cause the amplifier circuit to drive, into the load, a current that is substantially a replica of the input signal.

In some embodiments, the load includes an antenna.

In some embodiments, the antenna has a length less than one half of a wavelength corresponding to a maximum frequency of the radio frequency signal.

In some embodiments, the load further includes an inductor or a capacitor connected in series with the antenna.

In some embodiments, the antenna has a length of less than one half of a wavelength corresponding to a resonant frequency of the load.

In some embodiments, the amplifier circuit is a switching amplifier.

BRIEF DESCRIPTION OF THE DRAWINGS

These and other features and advantages of the present disclosure will be appreciated and understood with reference to the specification, claims, and appended drawings wherein:

FIG. 6A is a schematic diagram of a portion of a switching amplifier, according to an embodiment of the present disclosure;

FIG. 6B is a schematic diagram of a portion of a switching amplifier, according to an embodiment of the present disclosure;

FIG. 6C is a block diagram of a portion of a switching amplifier, according to an embodiment of the present disclosure;

DETAILED DESCRIPTION

The detailed description set forth below in connection with the appended drawings is intended as a description of exemplary embodiments of a drive circuit with predistortion provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
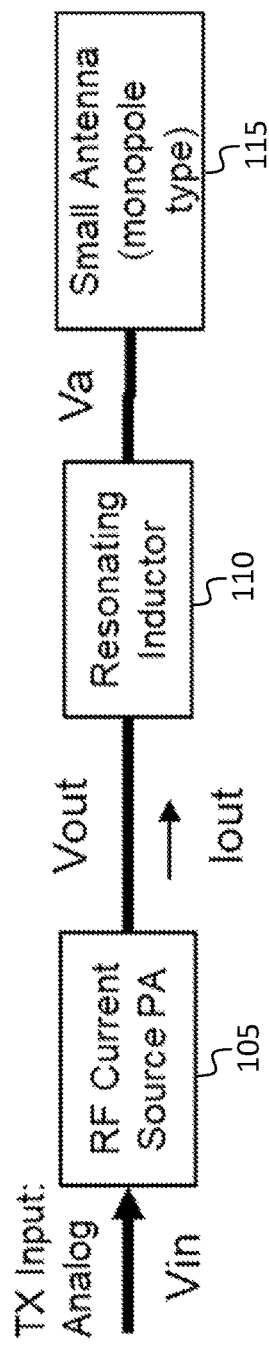
FIG. 1A is a block diagram of a system for transmitting, according to an embodiment of the present disclosure.
Figure 1B:
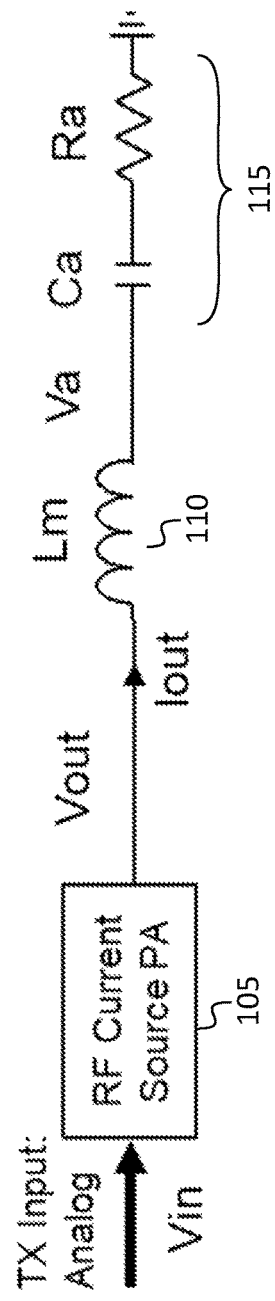
FIG. 1B is an equivalent circuit diagram of a system for transmitting, according to an embodiment of the present disclosure.

FIG. 1A shows a high-level block diagram of a transmitter, in some embodiments, and FIG. 1B shows an equivalent circuit of the transmitter. The radio frequency (RF) current source (CS) power amplifier (PA) (which may be referred to as an RFCS PA) has an analog input at which an input signal, representing the radio frequency (RF) waveform (which may occupy a certain bandwidth around a center frequency) to be transmitted through the antenna, is received. The RFCS PA generates an output voltage Vout, which is distorted from Vin, such that the output current, Iout, flowing into the load is a replica of the input signal. The load may be a resonant circuit with a resonant frequency near the center frequency, e.g., it may be the series combination of a resonating inductor 110 (if the antenna is not already resonant) and a small antenna 115 (having a length less than one fifth of the operating wavelength), or it may be a resonant antenna, such as a quarter-wave monopole antenna (for which the circuit of FIG. 1B may be a good model in a range of frequencies around a resonant frequency of the antenna). In some embodiments, the antenna has a length less than one half of the operating wavelength. In some examples, the input signal Vin is a voltage on a conductor. In other examples, it is a current. In still other examples, it is a digital representation. In some embodiments the load includes (e.g., consists of) an antenna that is inductive at the center frequency (e.g., a loop antenna or cavity backed slot antenna), connected in series with a resonating capacitor.

Monopole antennas radiate due to time-varying current; the radiated field is directly proportional to the product of the current and the frequency. For small deviations about a center frequency, which may be the case for nearly all RF systems, the frequency dependence may be negligible. In some examples Vin is a direct representation of the desired radiated signal.

Figures 2A, 2B, 2C:
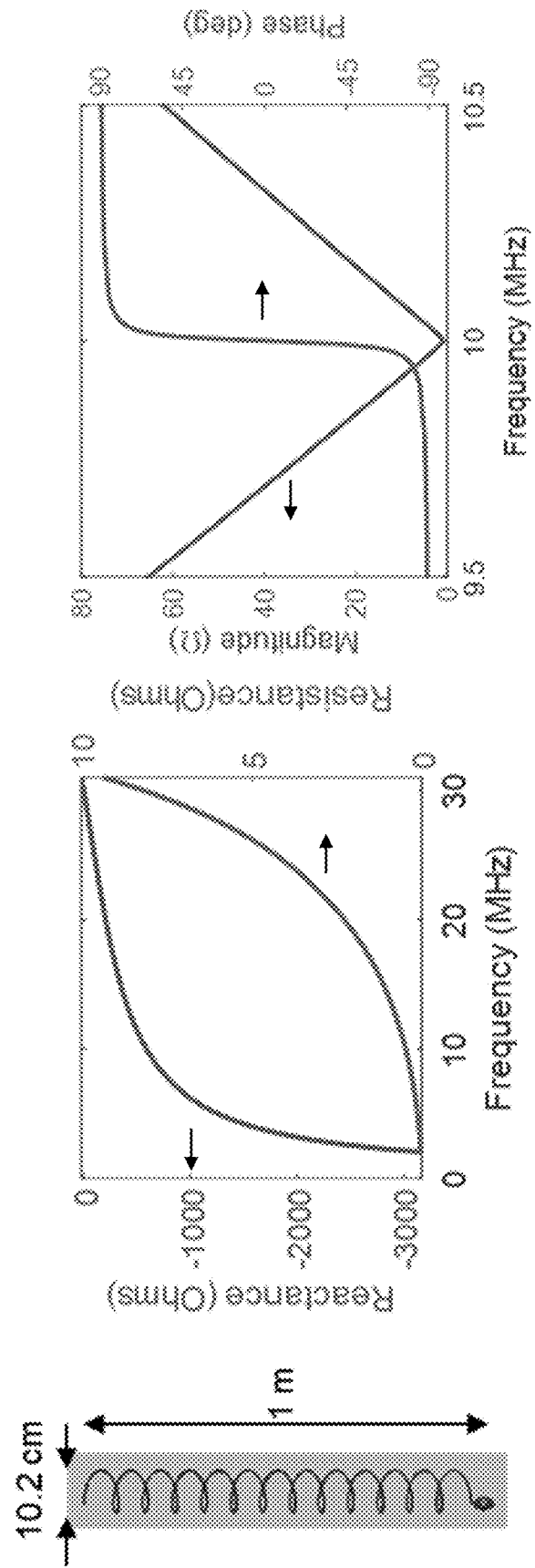
FIG. 2A is a perspective view of an antenna, according to an embodiment of the present disclosure.
FIG. 2B is a graph of impedance as a function of frequency, according to an embodiment of the present disclosure.
FIG. 2C is a graph of impedance as a function of frequency, according to an embodiment of the present disclosure.

In some embodiments, the antenna is resonated with a series inductance, Lm, because doing so may significantly reduce the voltage Vout that results in a given radiated field (see FIGS. 2A-2C) and may provide comparably lower dispersion and harmonic distortion. In the example shown in FIGS. 2A-2C, the antenna reactance is −585 ohms at 10 MHz, and it takes 585 V to drive 1 A into the antenna. If the antenna is resonated with a series inductor, less than 1 V may be sufficient at resonance and less than 60 V may be sufficient over a 1 MHz bandwidth, to drive 1 A into the antenna, and the antenna current is equal to Iout. On the other hand, if the antenna is instead resonated with a shunt inductor, the drive voltage that would cause a current of 1 A to flow into the antenna would be approximately 585 V over the entire band. As the power increases, so does the voltage requirement on the antenna. It may be difficult to supply a voltage of this magnitude from a power amplifier. The resonance frequency may be tuned by changing the resonating inductor 110, or using other approaches, such as variometers or tap switching. An example is shown in FIGS. 2A-2C. FIG. 2A shows a 1 m×10.2 cm normal mode helix that may be employed as an antenna. FIG. 2B shows the reactance and resistance components of the impedance of this antenna. In FIG. 2C the antenna is resonated at 10 MHz with a 9.3 uH series inductor. FIG. 2C shows the magnitude and phase components of the impedance of a series combination of a 9.3 uH inductor and the antenna of FIG. 2A. In some embodiments, this 9.3 uH inductor may comprise a helical conductor, further comprising metallic pipe, strip, or wire. As mentioned above, this inductor may be configured to be variable in order to enable frequency tuning.

Figure 3A:
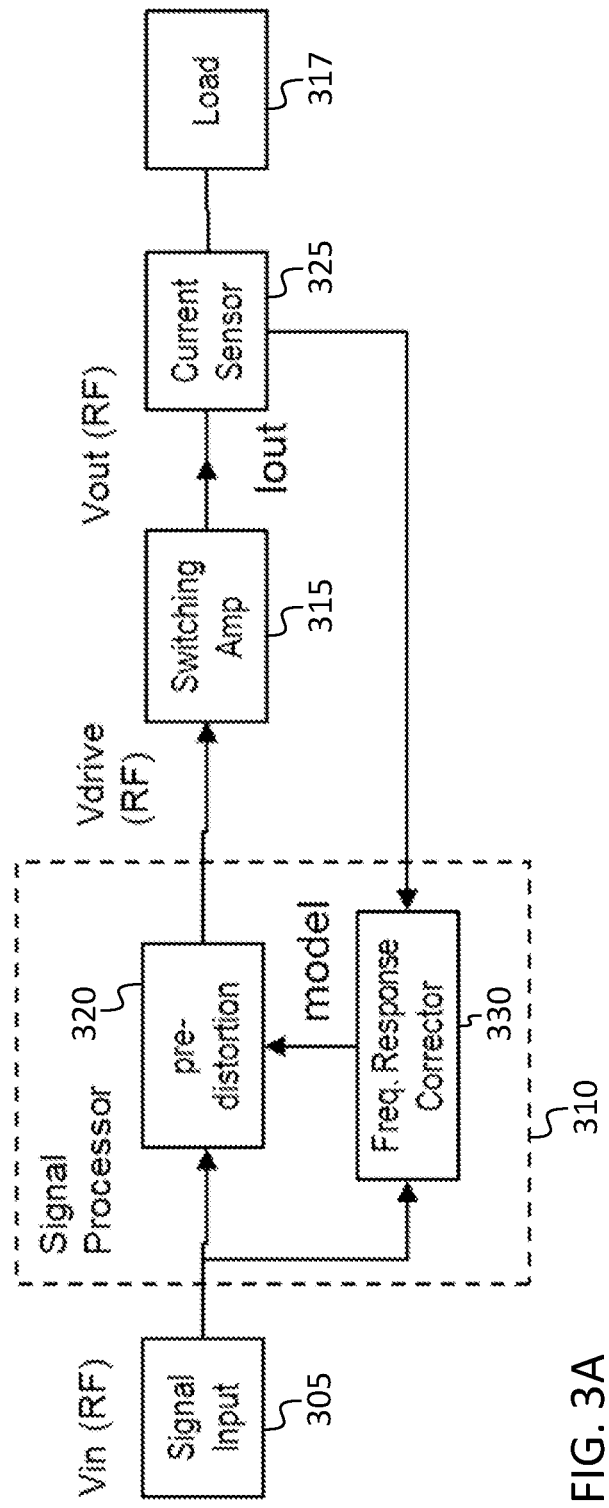
FIG. 3A is a block diagram of a system for transmitting, according to an embodiment of the present disclosure.
Figure 3B:
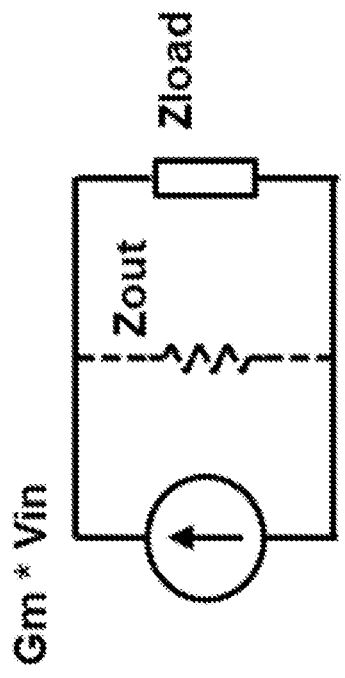
FIG. 3B is an equivalent circuit diagram, according to an embodiment of the present disclosure.

A functional block diagram of some embodiments is shown in FIGS. 3A and 3B. The RFCS PA comprises an input configured to receive an analog representation of the desired antenna current. In some embodiments this is an analog voltage waveform and the input comprises a transmission line (e.g. a coaxial cable). In other embodiments, it comprises a digital stream representing the waveform. A signal processor 310 is configured with an input to accept a first RF signal at the input of the RFCS PA and an output, configured to source a second RF signal (Vdrive), which is different from the first RF signal. The second RF signal is a representation of the voltage that is to be delivered to the load in order to drive the desired current into the load (which may be, e.g., a resonated antenna). This second RF signal may, like the first RF signal, be an analog voltage or a digital representation. The signal processor 310 may be or include an analog circuit, or it may be or include a digital circuit (e.g., a digital signal processor (DSP)), or it may be or include a circuit that includes both one or more analog circuits and one or more digital circuits.

Figures 4A, 4B:
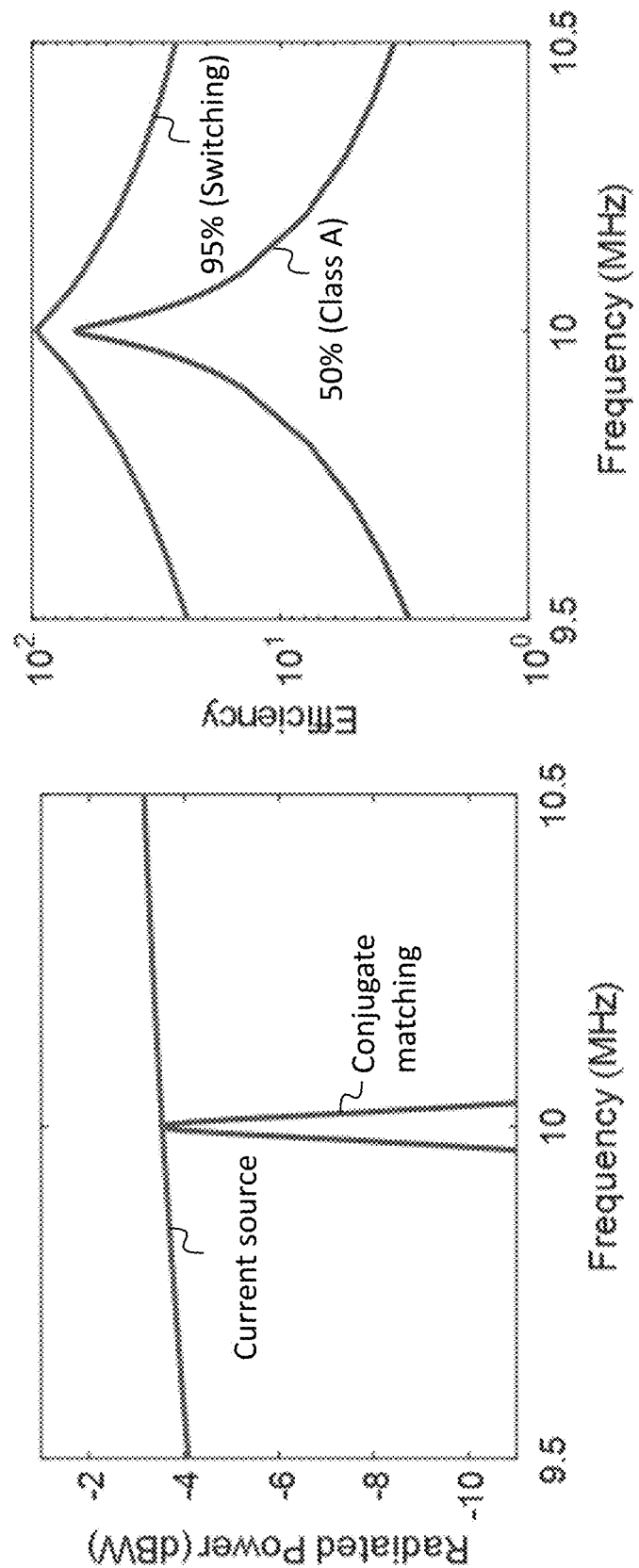
FIG. 4A is a graph of radiated power as a function of frequency, according to an embodiment of the present disclosure.
FIG. 4B is a graph of efficiency as a function of frequency, according to an embodiment of the present disclosure.

An amplifier circuit, e.g., a switching amplifier 315 such as a voltage mode class D amplifier, may be configured to generate a third RF signal Vout, which is an analog voltage, and is substantially the product of Vdrive and a voltage gain Av (Vout=Av*Vdrive). When connected to a load 317, current Iout flows in response to the driving voltage Vout. The signal processor 310 may comprise a predistortion circuit 320 such that Iout within a band of interest is substantially equal to the product of Vin and a transconductance Gm: Iout=Gm*Vin, resulting in the equivalent circuit illustrated in FIG. 3B. The transconductance Gm may include time delay. The predistortion circuit 320 may be or include an analog circuit, or it may be or include a digital circuit (e.g., a digital signal processor (DSP)), or it may be or include a circuit that includes both one or more analog circuits and one or more digital circuits. The transfer function of the predistortion component 320 may be given by T=Gm/Av*Zload, where Zload is the impedance of the load. The transconductance Gm may have a magnitude that is substantially constant with frequency, and it may have a phase (as a function of frequency) corresponding to a time delay (e.g., a phase that is a linear function of frequency). The time delay may, e.g., correspond to time delay resulting from (e.g., digital) signal processing operations in the predistortion circuit 320. In some embodiments, Gm is frequency independent except for delay (so that the current is a (possibly delayed) replica of the input signal) and T is the frequency-dependent transfer function that causes Gm to have this characteristic. In some embodiments, the gain of the predistortion component is limited, for example by artificially placing a virtual shunt resistance Zout in parallel (see FIG. 3B) when calculating the transfer function. The transfer function then becomes T=Gm/Av*Zload*Zout/ (Zload+Zout). If Zout is real, then T is nearly equal to the ideal value when Zload<<Zout and the magnitude of T is limited to T<Gm/Av*Zout. Therefore, it may be advantageous to set Zout to be much greater than the maximum impedance that is expected within the band. The frequency response of the system is illustrated in FIGS. 4A and 4B. FIG. 4A shows radiated power as a function of frequency in two circumstances, (i) one in which the antenna is driven by a current source and (ii) one in which the load (including the antenna and the resonating inductor) is driven by an impedance-matched source, through a conjugate matching circuit. FIG. 4B shows the efficiency (the ratio of (i) radiated power to (ii) electrical power supplied to the circuit, in two circumstances, (i) one in which the amplifier is a class A amplifier, and (ii) one in which the amplifier is a switching amplifier.

In some embodiments, the predistortion circuit 320 is based on a model of the load impedance, which may be prone to errors due to tolerances, aging, and environmental effects. For example, errors in the resonance frequency may result in too great a voltage being applied at the actual resonance and insufficient voltage being applied at the modeled resonance. In order to address these factors, some embodiments further include a current sensor 325 that senses the current driven into the load and a frequency response corrector 330 which may be a circuit that updates the model of the impedance for the predistortion. In such an embodiment, the signal processor 310 may be a digital signal processor (DSP), implementing (e.g., as a result of instructions executed by the DSP) a filter with real-time variable frequency response. In some examples this is a discrete time filter (e.g., a finite impulse response filter or an infinite impulse response filter) with variable weights, or "coefficients". If the input is an analog voltage, the current sensor 325 or the frequency response corrector 330 further comprises an analog to digital converter (ADC).

The frequency response corrector 330 may evaluate the error in frequency response between the input signal and output signal over a period much longer than a cycle of the RF waveform. This may be accomplished by means of discrete frequency transforms. The frequency response corrector 330 may further estimate the error in the model being used in the predistortion component and update the model. This process may be performed on a timescale faster than environmental changes. In some examples, it may be sufficient to update the model every second. In other examples, it may be sufficient to update the model every 100 ms and in other examples it may be sufficient to update the model every minute.

For example, the frequency response corrector 330 may estimate the transfer function from the input signal to a load current, (e.g., by taking the ratio of (i) a discrete Fourier transform (DFT) (e.g., a fast Fourier Transform (FFT)) of a signal from the current sensor to (ii) a DFT of the input). The frequency response corrector 330 may then adjust the frequency response of the predistortion circuit (e.g., by adjusting the coefficients of a discrete time filter of the predistortion circuit 320) so as to reduce a difference between the estimated transfer function and a target transfer function. The target transfer function may be one that results in the sensed current (which may be the load current) being substantially a replica of the input signal, e.g., the target transfer function may have a magnitude that is constant as a function of frequency and a phase that is a linear function of frequency. The sensed current being "substantially a replica of the input signal", as used herein, means that the sensed current is substantially equal to (e.g., differs by a mean squared error of less than 30% from (e.g., that differs by less than 5% or 1% from)) a function that is proportional to the input signal and that may be shifted in time (e.g., delayed) with respect to the input signal.

The switching amplifier 315 enables the RFCS PA to drive reactive loads without dissipating the reactive power (in contrast to conventional class A B amplifiers, which absorb reflected reactive power). The power dissipated in an amplifier may be a fraction of the apparent power. Therefore, the efficiency may be defined to be the ratio of (i) the power delivered to the load to (ii) the power delivered plus the power dissipated. Switching amplifiers (e.g., class D amplifiers) may approach 100% efficiency. The efficiency vs. frequency of driving the load above may be evaluated assuming 95% amplifier efficiency (power delivered/apparent power). Class A amplifiers, on the other hand, are limited to 50% efficiency, or less, into a resistive load. It is apparent from FIG. 4B that switching amplifiers may be capable of achieving greater than 20% efficiency with a frequency offset of 500 kHz, whereas a class A amplifier may be limited to 3%, and even reaching this efficiency level may be impractical for some signals of interest.

Figure 5:
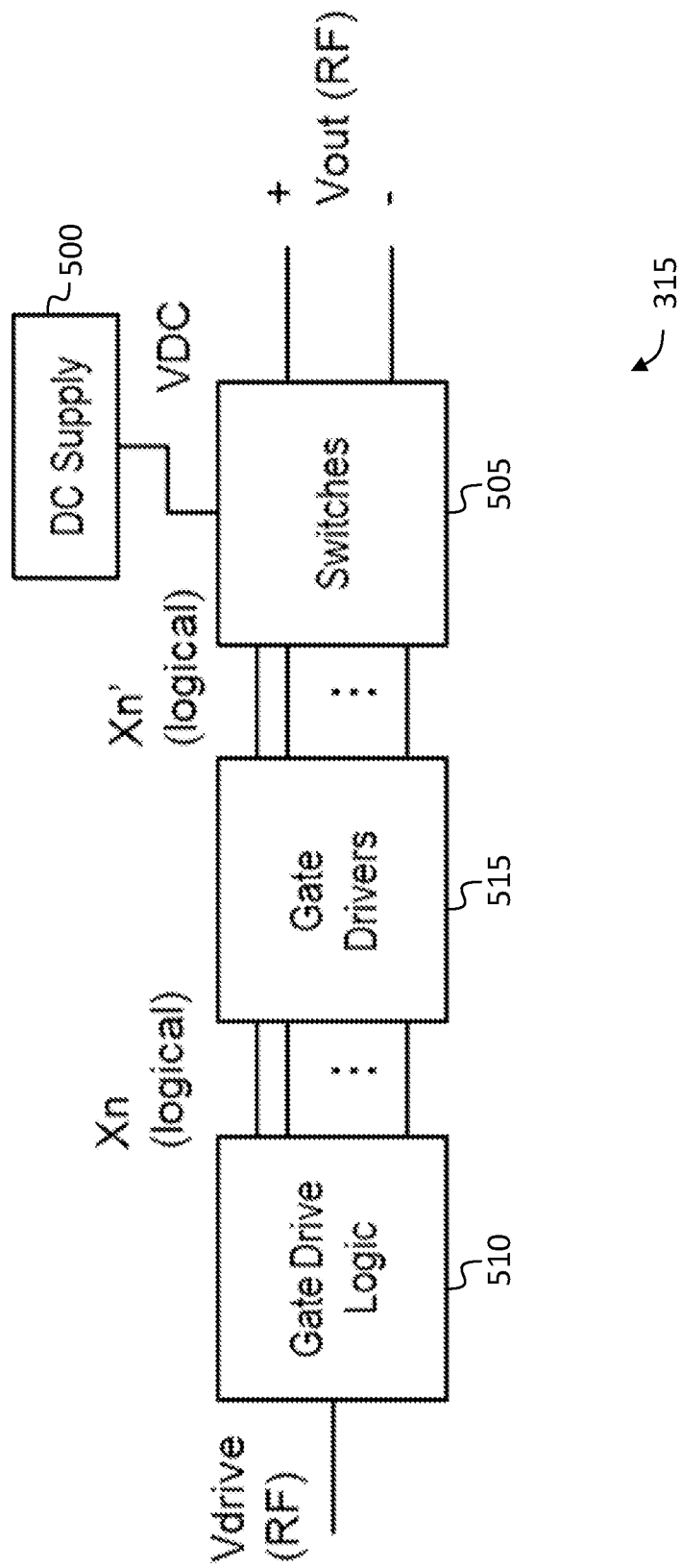
FIG. 5 is a block diagram of a switching amplifier, according to an embodiment of the present disclosure.

FIG. 5 is a block diagram of the switching amplifier 315, in some embodiments. The switching amplifier 315 has an RF input configured to accept the signal Vdrive, an input to accept a high power DC supply voltage VDC, and an output Vout configured to drive a load. A network of switches 505 is configured to couple the DC supply 500 to the output in arrangements (described in further detail below) such that the fundamental frequency content of Vout is an amplified version of Vdrive. A gate-drive logic circuit 510 determines the desired state of each switch as a function of time and outputs a logical signal Xn for each switch accordingly. A plurality of gate drivers 515 takes the logical gate drive signal and derives a second set of signals Xn' that are suitable for driving the switches. The gate drivers may be isolated gate drivers or otherwise comprise an isolation mechanism such that the switches may be floating from ground. In one example relevant to gallium nitride (GaN) switches, the logical signals Xn' are 0 V/5 V TTL logic referenced to earth ground, while Xn' are 0 V/5 V signals referenced to a local ground and capable of sourcing 1 W of switching losses.

Figure 6D:
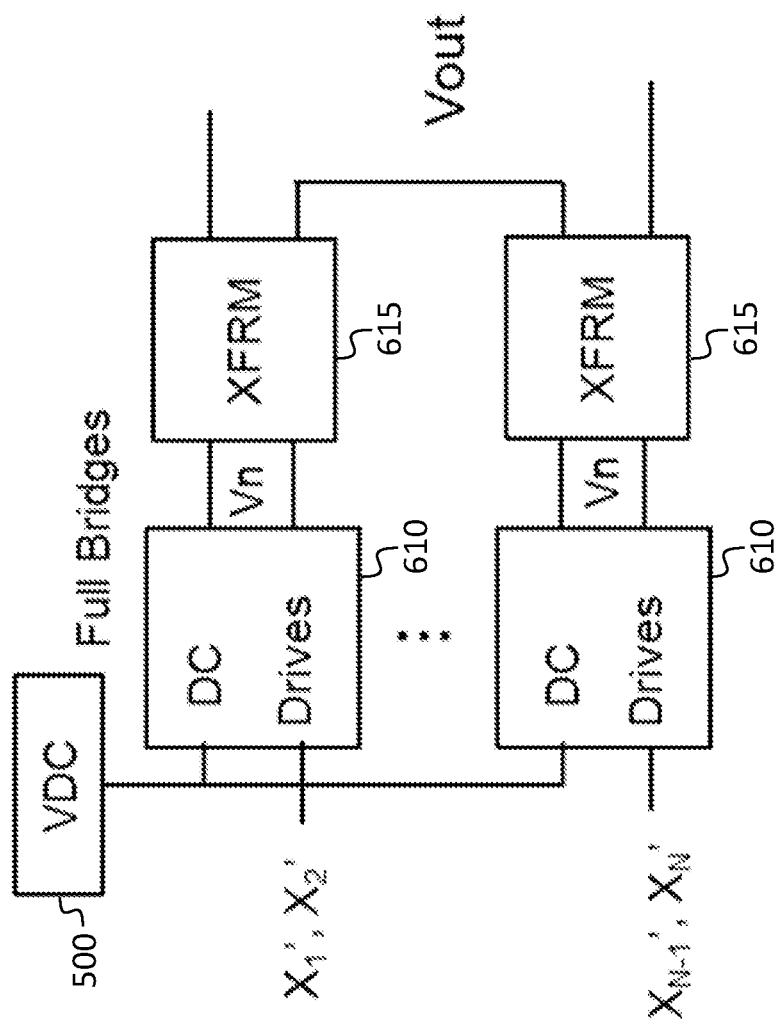
FIG. 6D is a block diagram of a portion of a switching amplifier, according to an embodiment of the present disclosure.

Referring to FIG. 6A, a half bridge comprises two field effect transistors (FETs) 605 (these could instead be IGBTs, MOSFETs, GaN, SiC or another (e.g., future technology) configured between positive and negative supply rails V+ and V−. In some examples, V+ is VDC and V− is ground. An output Vn is taken at the point between the two switches. Gate drive circuitry is connected to place a potential between the gate and the source of each switch (this detail is not illustrated, for clarity). When Xn' is true then the top switch is on and the bottom switch is off and Vn=V+; when Xn' is false then the bottom switch is on and the top switch is off and Vn=V−. Transitions may be managed (to provide "dead time" during each transition) such that there is no point in time at which both switches are on, establishing a low-resistance path, through the two switches, between V+ and V−. Thus the output is directly connected to either the positive or negative rail and the output is a pulse waveform. The switches do not dissipate power to first order since they are always fully on or fully off. Reactive power returned from the load is simply returned to the power supply. If the half bridge is connected to the series resonant load of FIGS. 1A and 1B and driven with a square wave near the resonance frequency, then the resulting current may be approximately a sine wave with amplitude equal to the ratio of the amplitude of the first harmonic of the square wave divided by the load impedance at that frequency. However, this does not provide amplitude control. The amplitude can be controlled by pulse-width modulating Vdrive onto a higher frequency pulse width modulation (PWM) carrier (e.g., 10× the RF frequency), for example by comparing the input voltage with a triangle wave at the PWM carrier frequency. With appropriate filtering (e.g., the filtering provided by the non-flat frequency response of the circuit of FIGS. 1A and 1B, or filtering provided by a separate, dedicated filter (which may be added to account for higher order resonances in the load)) the current will not respond to the PWM carrier and only the RF current will flow. 0%, 50% and 100% duty cycle on the PWM carrier corresponds to RF instantaneous potential of V−, (V++V−)/2, and V+, respectively.

In some embodiments, a full bridge 610 (as illustrated in FIG. 6B) is used; it may afford additional flexibility. A full bridge may be compatible with PWM at a high frequency carrier. In addition, it can be used to perform PWM at the RF frequency. If the left bridge is high and the right bridge is low then Vn=V+−V−=VDC; if the left bridge is low and the right bridge is high then Vn=−VDC; and if the left and right are both either high or low, then Vn=0. Therefore, the full bridge enables a 3-level approximation to a sine wave with alternating positive and negative pulses. Driving with a square wave (50% duty cycle) provides the maximum amplitude; reducing the duty cycle reduces the amplitude.

The full bridges may be connected in series to provide multi-level outputs, providing 2K+1 possible levels, where K is the number of full bridges. This has the advantages of providing a close approximation to the desired voltage (so that higher order frequency content is well out of band) while only switching at the RF frequency, which helps to minimize switching losses. While switching at the RF frequency, the smallest signals turn on only one bridge while the largest signals turn on all bridges. Vout is the sum of Vn on each of the bridges.

Such an embodiment may use galvanic isolation of the output terminals from ground. There are two methods for accomplishing this. In a first method, each bridge has an isolated DC supply (FIG. 6C); in a second method (illustrated in FIG. 6D), the outputs of each of the bridges are connected with transformers 615, the secondaries of which are connected in series. It is understood that the output of any of these embodiments may include inductive filtering (reducing high frequency content compared to the load alone), DC blocking (avoiding saturation of output transformers), or transformer coupling (providing galvanic isolation or impedance scaling).

Figure 7:
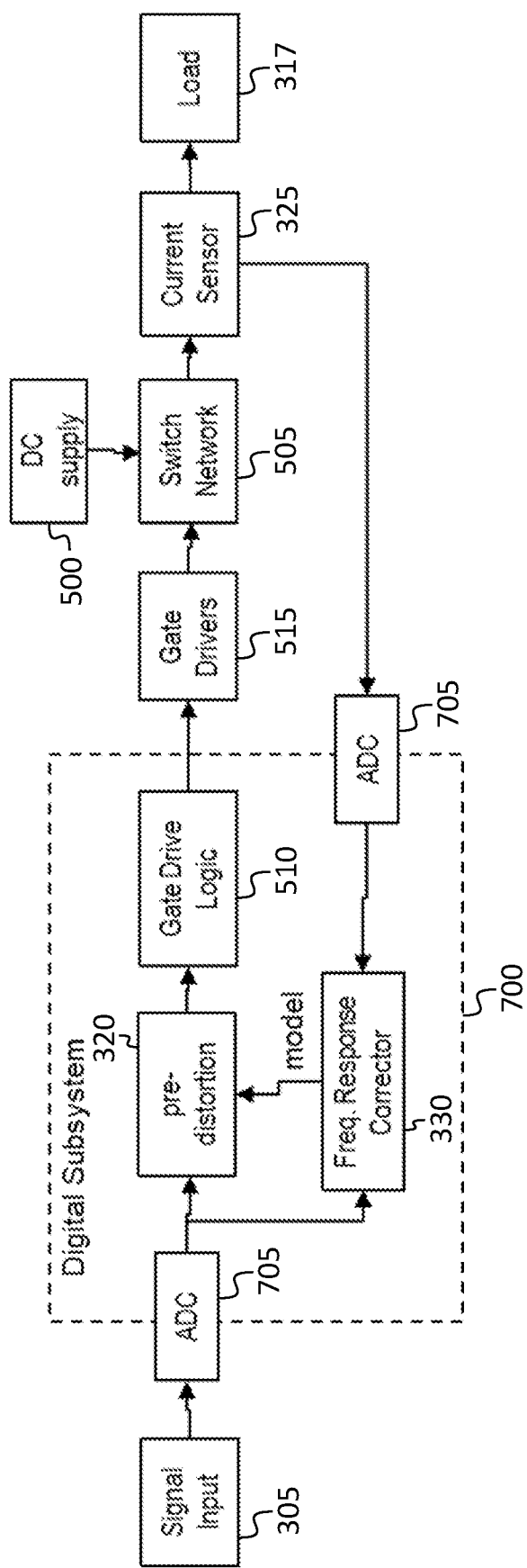
FIG. 7 is a block diagram of a system for transmitting, according to an embodiment of the present disclosure.

An example of some embodiments, comprising an analog voltage input and a digital subsystem 700, is shown in FIG. 7. The digital subsystem comprises ADCs 705 to interface with analog signals and may further comprise a field programmable gate array. The input signal is converted to a digital stream by an ADC 705 and is fed to the predistortion circuit 320, which generates Vdrive as a digital representation. The digital subsystem 700 then generates and outputs the gate drive logic signals. In some examples the gate drive logic generates the dead time for the switches (as discussed above), in which case there is one output for each switch. In other examples, the gate driver block generates dead time and there is one output for each half bridge. The gate drivers and DC supply 500 then drive the switch network as described in FIGS. 6A-6D. The switch network is coupled to the load through a current sensor 325, which may be, for example, a current transformer or a Rogowski coil. The measured current is fed back to the digital subsystem with a second ADC. The frequency response corrector 330 periodically evaluates and updates the model (e.g., the filter coefficients of the predistortion circuit 320).

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

It will be understood that when an element is referred to as being "directly connected" or "directly coupled" to another element, there are no intervening elements present. As used herein, "operatively coupled" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although exemplary embodiments of a drive circuit with predistortion have been specifically described and illustrated herein, many modifications and variations will be apparent to those skilled in the art. Accordingly, it is to be understood that a drive circuit with predistortion constructed according to principles of this disclosure may be embodied other than as specifically described herein. The invention is also defined in the following claims, and equivalents thereof.

What is claimed is:

1. A system, comprising:
   a signal input;
   a predistortion circuit; and
   an amplifier circuit,
   the predistortion circuit being operatively coupled to the signal input and to the amplifier circuit and configured to modify a radio frequency (RF) signal received at the signal input to cause the amplifier circuit to drive, into a load connected to the amplifier circuit, a current that is substantially a replica of the input signal.

2. The system of claim 1, wherein the load comprises an antenna.

3. The system of claim 2, wherein the system is configured to operate within an operating frequency range, and the antenna has a length less than one half of a wavelength corresponding to the maximum frequency in the operating frequency range.

4. The system of claim 2, wherein the load further comprises an inductor or a capacitor connected in series with the antenna.

5. The system of claim 4, wherein the antenna has a length of less than one half of a wavelength corresponding to a resonant frequency of the load.

6. The system of claim 1, wherein the amplifier circuit is a switching amplifier.

7. The system of claim 1, further comprising a current sensor, configured to measure a load current.

8. The system of claim 7, further comprising a frequency response corrector for adjusting the frequency response of the predistortion circuit.

9. The system of claim 8, wherein the frequency response corrector is configured:
   to estimate a transfer function from a signal at the signal input to a load current; and
   to adjust the frequency response of the predistortion circuit so as to reduce a difference between the estimated transfer function and a target transfer function.

10. The system of claim 9, wherein the target transfer function has a magnitude that is constant as a function of frequency.

11. The system of claim 9, wherein the target transfer function has a phase that is a linear function of frequency.

12. The system of claim 8, wherein the predistortion circuit comprises a discrete time filter having a plurality of coefficients, and the frequency response corrector is configured to adjust the coefficients.

13. The system of claim 12, wherein the discrete time filter is a finite impulse response filter.

14. The system of claim 12, wherein the discrete time filter is an infinite impulse response filter.

15. A method for driving a load with a system,
   the system comprising:
      a signal input;
      a predistortion circuit; and
      an amplifier circuit,
   the method comprising:
      modifying, by the predistortion circuit, a radio frequency (RF) signal received at the signal input to cause the amplifier circuit to drive, into the load, a current that is substantially a replica of the input signal.

16. The method of claim 15, wherein the load comprises an antenna.

17. The method of claim 16, wherein the antenna has a length less than one half of a wavelength corresponding to a maximum frequency of the radio frequency signal.

18. The method of claim 16, wherein the load further comprises an inductor or a capacitor connected in series with the antenna.

19. The method of claim 18, wherein the antenna has a length of less than one half of a wavelength corresponding to a resonant frequency of the load.

20. The method of claim 15, wherein the amplifier circuit is a switching amplifier.

\* \* \* \* \*

UNITED STATES PATENT AND TRADEMARK OFFICE
CERTIFICATE OF CORRECTION

| | | |
|---|---|---|
| PATENT NO. | : 12,136,902 B1 | Page 1 of 1 |
| APPLICATION NO. | : 18/312979 | |
| DATED | : November 5, 2024 | |
| INVENTOR(S) | : Carson White et al. | |

It is certified that error appears in the above-identified patent and that said Letters Patent is hereby corrected as shown below:

In the Specification

Column 1, Line 11:
Insert:
-- GOVERNMENT LICENSE RIGHTS
This invention was made with Government support under Contract No. N6600122C4505 awarded by Naval Information Warfare Center. The Government has certain rights in the invention. --

Signed and Sealed this
Fourth Day of November, 2025

John A. Squires
*Director of the United States Patent and Trademark Office*